(12) United States Patent
Xi et al.

(10) Patent No.: US 8,541,247 B2
(45) Date of Patent: Sep. 24, 2013

(54) NON-VOLATILE MEMORY CELL WITH LATERAL PINNING

(75) Inventors: Haiwen Xi, San Jose, CA (US); Antoine Khoueir, Apple Valley, MN (US); Brian Lee, Boston, MA (US); Patrick J. Ryan, St. Paul, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 245 days.

(21) Appl. No.: 12/973,536

(22) Filed: Dec. 20, 2010

(65) Prior Publication Data

US 2012/0153413 A1    Jun. 21, 2012

(51) Int. Cl.
*H01L 27/115* (2006.01)

(52) U.S. Cl.
USPC ............... 438/3; 257/E27.104; 257/E29.323

(58) Field of Classification Search
USPC ............ 257/421, 295, E27.104, E29.323
See application file for complete search history.

(56) References Cited

U.S. PATENT DOCUMENTS

| | | | |
|---|---|---|---|
| 6,548,114 B2 | 4/2003 | Mao et al. | |
| 6,795,279 B2 | 9/2004 | Singleton et al. | |
| 7,583,529 B2 | 9/2009 | Chen et al. | |
| 7,688,615 B2 | 3/2010 | Ho et al. | |
| 7,939,188 B2 * | 5/2011 | Xi et al. | 428/811.1 |
| 8,197,953 B2 * | 6/2012 | Xi et al. | 428/811.1 |
| 2005/0276090 A1 | 12/2005 | Yamagishi | |
| 2007/0187785 A1 | 8/2007 | Hung et al. | |
| 2010/0033880 A1 | 2/2010 | Dimitrov et al. | |
| 2010/0102406 A1 * | 4/2010 | Xi et al. | 257/421 |
| 2010/0109110 A1 | 5/2010 | Wang et al. | |

OTHER PUBLICATIONS

S. Ikeda, J. Hayakawa, Y.M. Lee, K. Miura, R. Sasaki, F. Matsukura, T. Meguro and H. Ohno, "Giant TMR in CoFeB/MgO/CoFeB Magnetic Tunnel Junctions," Extended Abstracts of the 2007 International Conference on Solid state Devices and Materials, 2007, pp. 746-747.
T. Kawahara, R. Takemura, K. Miura, J. Hayakawa, S. Ikeda, Y. Lee, R. Sasaki, Y. Goto, K. Ito, T. Meguro, F. Matsukura, H. Takahashi, H. Matsuoka and H. Ohno, "2Mb Spin-Transfer Torque RAM (SPRAM) with Bit-by-Bit Bidirectional Current Write and Parallelizing-Direction Current Read," 2007 IEEE International Solid-State Circuits Conference, 2007, pp. 480-481 & 617.
Y.M. Lee, J. Hayakawa, S. Ikeda, F. Matsukura and H. Ohno, "Effect of electrode composition on the tunnel magnetoresistance of pseudo-spin-valve magnetic tunnel junction with a MgO tunnel barrier," Applied Physics Letters 90, 2007, American Institute of Physics.
J. Hayakawa, S. Ikeda, Y.M. Lee, F. Matsukura and H. Ohno, "Effect of high annealing temperature on giant tunnel magnetoresistance ratio of CoFeB/MgO/CoFeB magnetic tunnel junctions," Applied Physics Letters 89, 2006, American Institute of Physics.

* cited by examiner

*Primary Examiner* — Benjamin Sandvik
(74) *Attorney, Agent, or Firm* — Hall Estill Attorneys at Law

(57) ABSTRACT

An apparatus and associated method for a non-volatile memory cell, such as an STRAM cell. In accordance with various embodiments, a magnetic free layer is laterally separated from an antiferromagnetic layer (AFM) by a non-magnetic spacer layer and medially separated from a synthetic antiferromagnetic layer (SAF) by a magnetic tunneling junction. The AFM pins the magnetization of the SAF through contact with a pinning region of the SAF that laterally extends beyond the magnetic tunneling junction.

8 Claims, 4 Drawing Sheets

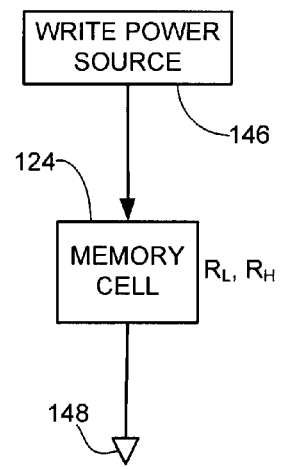
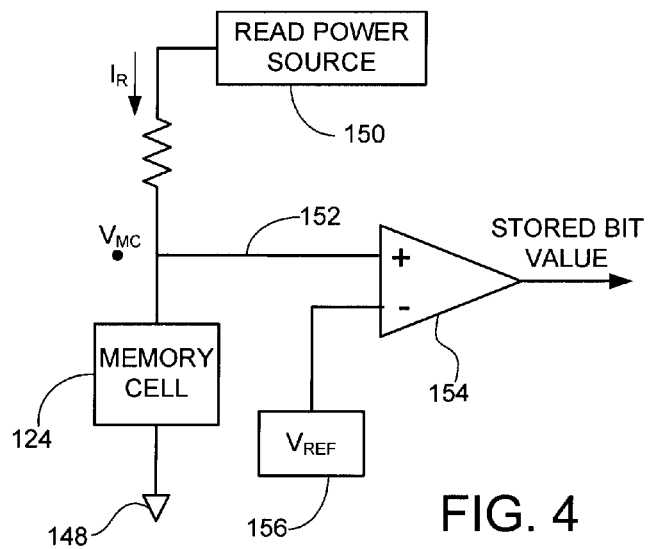
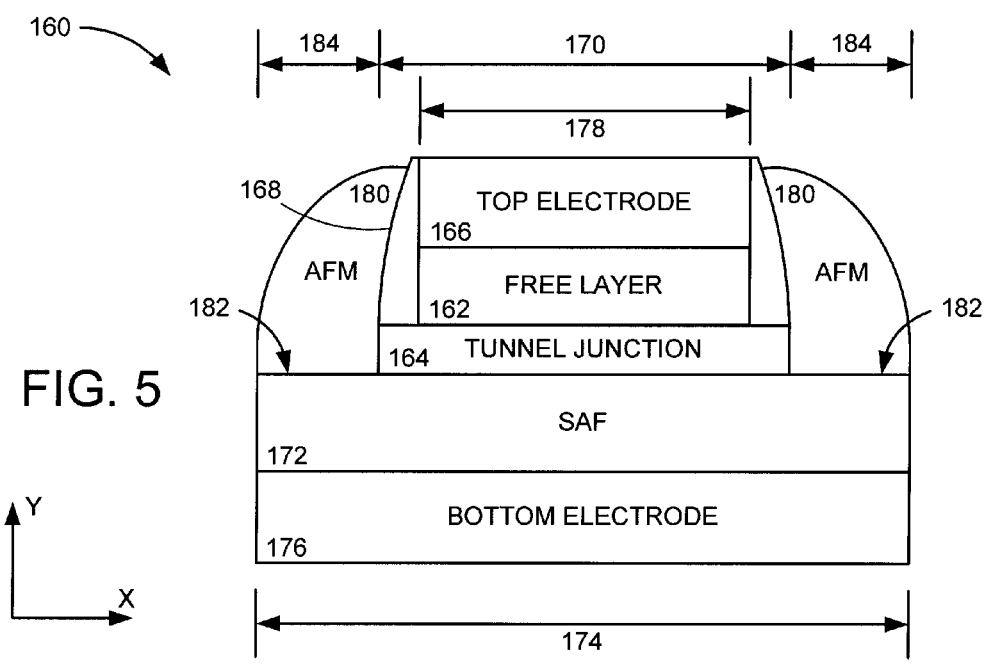

NON-VOLATILE MEMORY CELL WITH LATERAL PINNING

SUMMARY

Various embodiments of the present invention are generally directed to a non-volatile memory cell configured with a lateral magnetization pinning layer.

In accordance with various embodiments, a magnetic free layer is laterally separated from an antiferromagnetic layer (AFM) by a non-magnetic spacer layer and medially separated from a synthetic antiferromagnetic layer (SAF) by a magnetic tunneling junction. The AFM pins the magnetization of the SAF through contact with a pinning region of the SAF that laterally extends beyond the magnetic tunneling junction.

These and other features and advantages which characterize the various embodiments of the present invention can be understood in view of the following detailed discussion and the accompanying drawings.

BRIEF DESCRIPTION OF THE DRAWINGS

FIG. 3 generally illustrates a manner in which data can be written to a memory cell of the memory array.

FIG. 4 generally illustrates a manner in which data can be read from the memory cell of FIG. 3.

FIG. 5 shows an exemplary memory cell constructed and operated in accordance with the various embodiments of the present invention.

DETAILED DESCRIPTION

The present disclosure generally relates to non-volatile memory cells, such as spin torque random access memory (STRAM) cells. Solid state non-volatile memory is a developing technology aimed at providing reliable data storage and faster data transfer rates in ever decreasing form factors. However, several issues associated with solid state cells inhibit practical application, such as large switching current, low operating margin, and low areal density that results in low overall data capacity. In recent efforts, high volatility has further plagued solid state cells by degrading the cell's tunnel magnetoresistance (TMR) effect, which corresponds with reduced cell readability and writeability.

Accordingly, a solid state non-volatile memory cell with a synthetic antiferromagnetic (SAF) layer that is magnetically pinned by an antiferromagnetic layer (AFM) positioned lateral to a magnetic free layer reduces volatility while enhancing readability and writeability. The lateral orientation of the AFM to the free layer allows for high temperature annealing to increase the TMR of the cell without concurrently increasing volatility through volatile atom diffusion from the AFM. Such lateral configuration of the AFM also provides a smaller overall cell thickness which can lead to increased storage capacity in various data storage devices.

Figure 1:
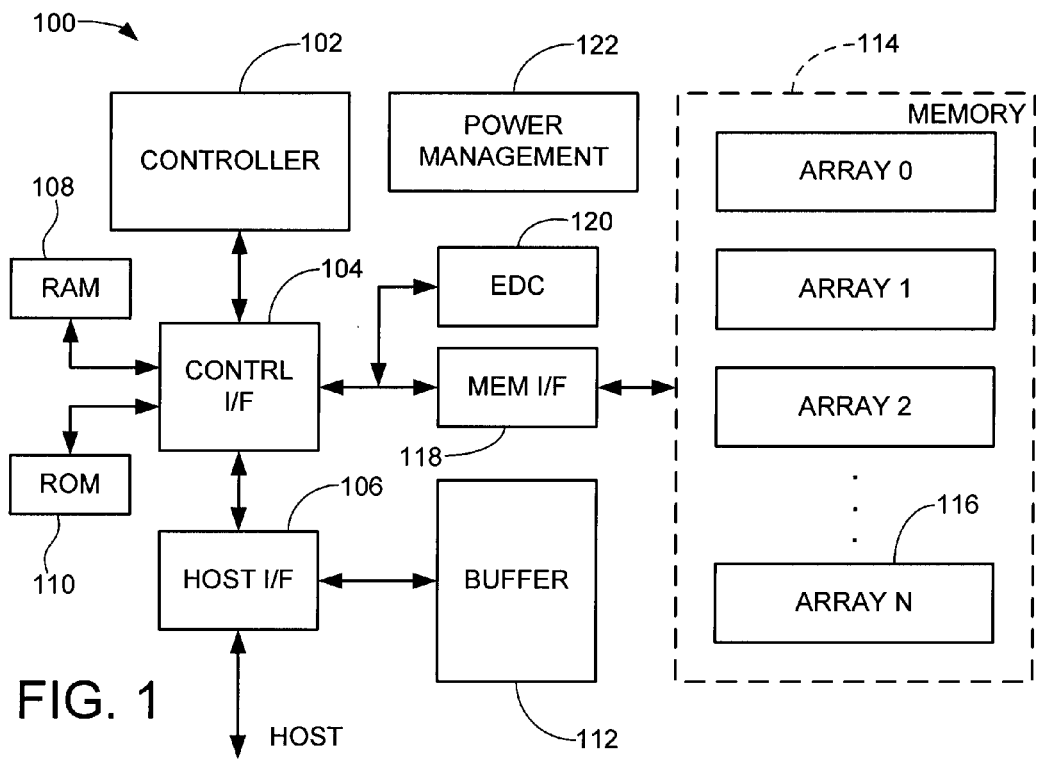
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
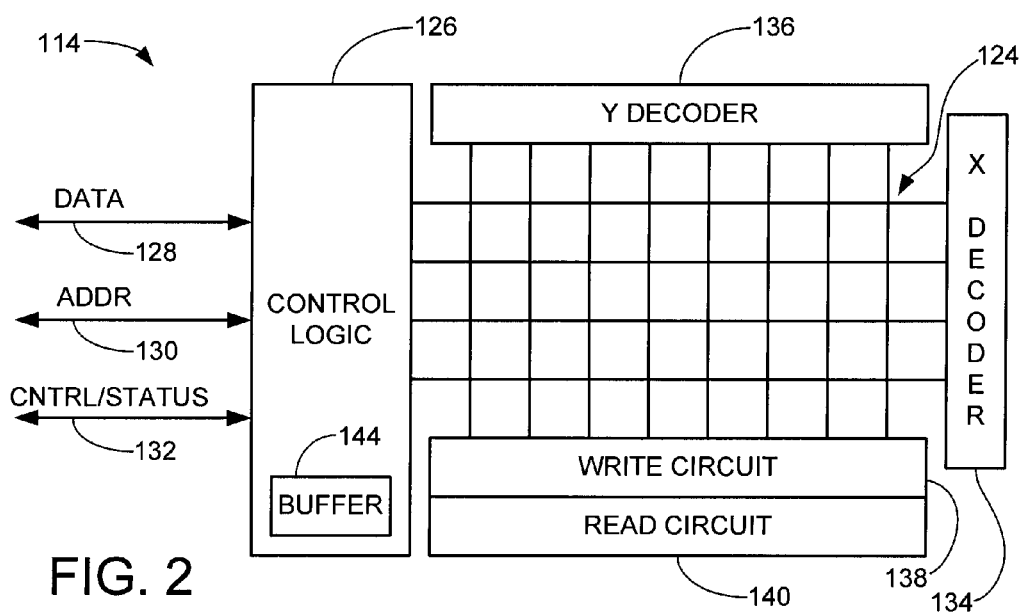
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of memory cells 124, accessible by various row (word) and column (bit) lines. The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Data are written to the respective memory cells 124 as generally depicted in FIG. 3. Generally, a write power source 146 applies the necessary input (such as in the form of current, voltage, magnetization, etc.) to configure the memory cell 124 to a desired state. It can be appreciated that FIG. 3 is merely a representative illustration of a bit write operation. The configuration of the write power source 146, memory cell 124, and reference node 148 can be suitably manipulated to allow writing of a selected logic state to each cell.

As explained below, in some embodiments the memory cell 124 takes a modified STRAM configuration, in which case the write power source 146 is characterized as a current driver connected through a memory cell 124 to a suitable reference node 148, such as ground. The write power source 146 provides a stream of power that is spin polarized by moving through a magnetic material in the memory cell 124. The resulting rotation of the polarized spins creates a torque that changes the magnetic moment of the memory cell 124.

Depending on the magnetic moment, the cell 124 may take either a relatively low resistance ($R_L$) or a relatively high resistance ($R_H$). While not limiting, exemplary $R_L$ values may be in the range of about 100 ohms ($\Omega$) or so, whereas exemplary $R_H$ values may be in the range of about 100K$\Omega$ or so. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). The voltage drop across the memory cell (voltage $V_{MC}$) is sensed via path 152 by the positive (±) input of a comparator (sense amplifier) 154. A suitable reference (such as voltage reference $V_{REF}$) is supplied to the negative (−) input of the comparator 154 from a reference source 156.

The voltage reference $V_{REF}$ can be selected from various embodiments such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

FIG. 5 generally illustrates a non-volatile memory stack 160 in accordance with various embodiments of the present invention. The stack 160 has a magnetic free layer 162 that is disposed between a magnetic tunnel junction 164, top electrode 166, and non-magnetic spacer layer 168, respectively. The tunnel junction 164 is oriented with a width 170 and is attached to a medial portion of a synthetic antiferromagnetic (SAF) layer 172 which has a width 174 that is shared by the contactingly adjacent bottom electrode 176.

As shown, the top electrode 166 and free layer 162 each have a width 178 that is shorter than the width of the tunnel junction 170. Such difference in width accommodates the spacer layer 168 which separates the free layer 162 from a laterally adjacent, as measured along the X axis, antiferromagnetic layer (AFM) 180. The AFM 180 provides a magnetic exchange bias that pins the magnetization of the SAF 172 through contact with a pinning region 182 of the SAF 172 which is defined by the difference in width 184 between the tunnel junction width 170 and the SAF width 174. Such lateral placement of the pinning regions 182 allows for AFM layers 180 to be placed on opposing lateral sides of the free layer 162 without adding any thickness, as measured in the Y axis, to the stack 160.

In operation, the free layer 162 is magnetically responsive to a predetermined programming current that sets a magnetic orientation in the layer 162, such as a positive or negative polarity. Such magnetic orientation functions in conjunction with the magnetically unresponsive SAF 172, which is pinned to a predetermined magnetization by the AFM 180, to produce a TMR effect that provides a logical state, such as 0 or 1, to be stored to the stack 160. The tunnel junction 164 subsequently allows the magnetic orientations of the SAF 172 and free layer 162 to interact to produce the TMR effect that can be read as a programmed logical state.

The functionality of the stack 160 can be enhanced by increasing the TMR effect, which corresponds to a larger magnetic difference between programmed logical states and lower programming current required to set and switch the magnetic orientation of the free layer 162. The TMR effect can be increased with exposure to elevated temperatures through annealing. However, such annealing can adversely affect the stack 160 by increasing volatility of the magnetizations of the SAF 172 and free layer 162 through atomic antiferromagnetic migration from the AFM 180.

With the memory stack 160 of FIG. 5, annealing can occur without increasing volatility due to the lateral placement of the AFM 180 compared to the SAF 172 and free layer 162. That is, the separation of the AFM 180 and free layer 162 by the non-magnetic spacer layer 168 combines with the lateral attachment of the AFM 180 to the SAF 172 along the pinning regions 182 to reduce migration of the volatile AFM atoms into the SAF 172 and free layer 162. As a result, the stack 160 can have greater readability and writeability through an enhanced TMR effect due to annealing in conjunction with low magnetic volatility.

Figure 6:
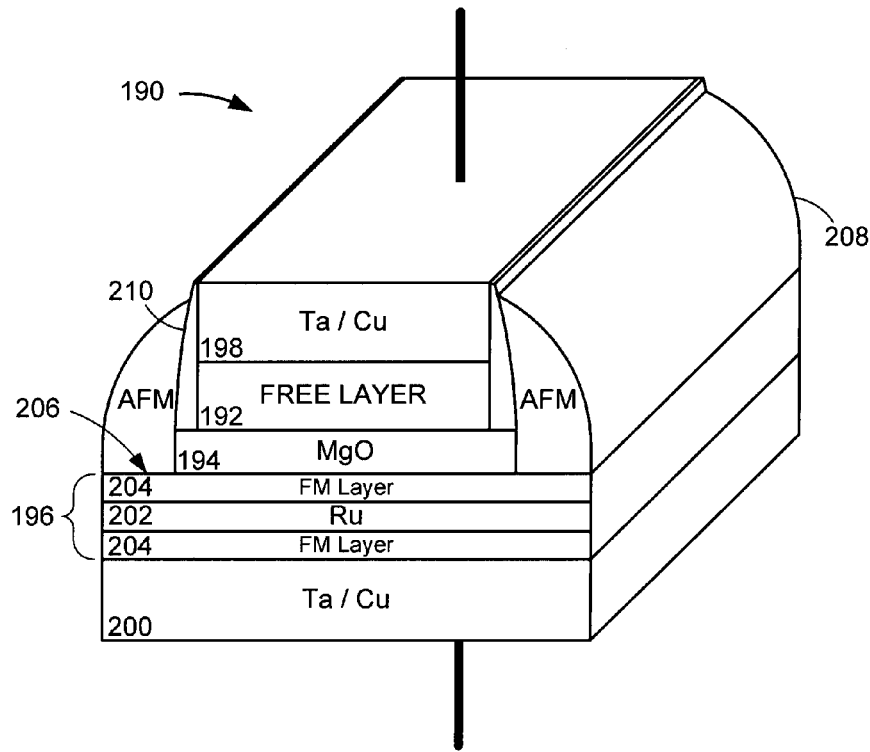
FIG. 6 illustrates an isometric representation of an exemplary memory cell constructed and operated in accordance with the various embodiments of the present invention.

FIG. 6 displays an isometric view of an exemplary non-volatile memory cell 190 that is constructed in accordance with various embodiments. A magnetic free layer 192 is attached to a tunnel junction 194 of MgO, which can advantageously contribute to producing TMR by having a reduced thickness that brings the free layer 192 closer to the SAF trilayer 196. The free layer 192 and SAF trilayer 196 are each respectively attached to top and bottom electrodes 198 and 200 that can be various current conducting materials, such as, but not limited to, Ta and Cu, that are capable of transmitting current through the cell 190.

The SAF trilayer 196, as displayed, can have a coupling spacer layer 202, such as Ru, disposed between a pair of ferromagnetic layers 204, which can be various materials not limited to metals like Ni and Co, alloys like CoFe and NiFe, and high polarization ratio compounds like CoFeB. Such ferromagnetic layers 204 are magnetically responsive to an exchange bias imparted along the pinning region 206 of the SAF 196 from the AFM 208, which can be any antiferromagnetically ordered material such as PtMn and IrMn.

However, it has been observed that Manganese is especially volatile and the atoms easily diffuse throughout a cell when annealed. Thus, diffusion from the AFM 208 is throttled by the limited attachment of the SAF 196 to the AFM 208. In other words, the limited surface area of the pinning region 206 inhibits Manganese atoms from diffusing through the cell 190 and increasing magnetic volatility. Diffusion is further inhibited by non-magnetic spacer layer 210 that physically and magnetically separates the AFM 208 from the free layer 192 and top electrode 198.

As such, the cell 190 can undergo TMR enhancing annealing with minimal migration of Mn atoms and maintenance of the AFM's 208 ability to generate exchange bias that pins the magnetization of the SAF 196. As a read or write current is transmitted through the cell 190, the combination of thin MgO tunnel junction 194, lateral AFM 208 orientation, and annealing allow for elevated TMR effect in a thinner cell, which results in higher margin between logical states, lower programming current, and increased areal density in a data storage device.

Figure 7:
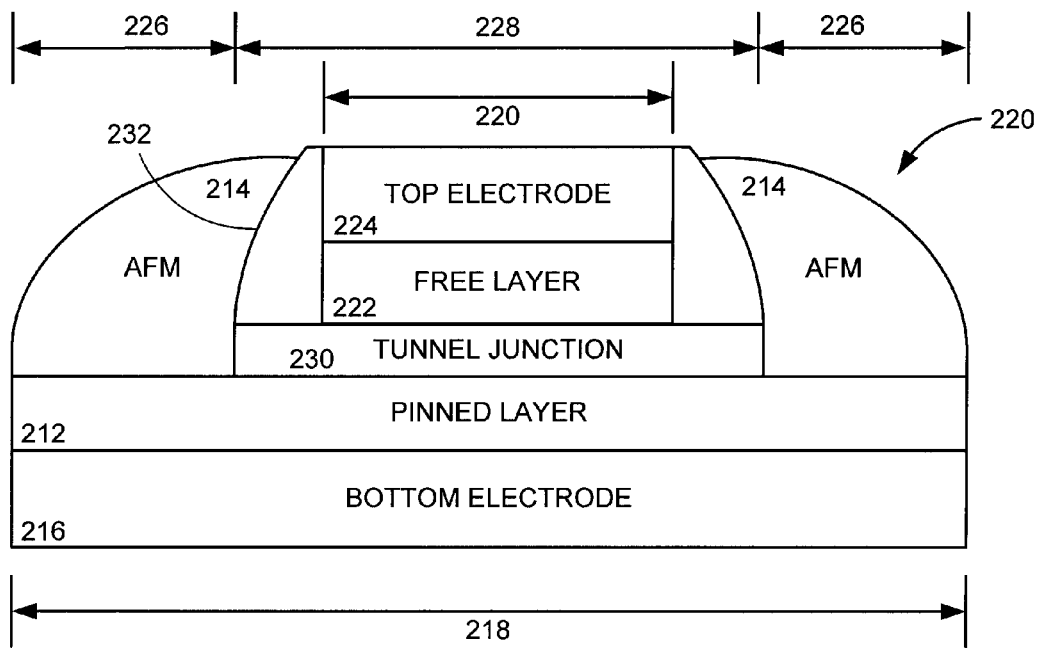
FIG. 7 displays an exemplary alternative construction of a memory cell.

In FIG. 7, another exemplary cell 210 is shown with a single ferromagnetic pinned layer 212 in the place of the SAF of FIG. 6. Similarly to the operation of the cell 190 of FIG. 6, the cell 210 pins the magnetization of the ferromagnetic pinned layer 212 with laterally disposed AFM layers 214. The use of a single ferromagnetic pinned layer 212 allows the cell 210 to have a reduced thickness with respect to cell 190 while still inhibiting diffusion of volatile atoms during annealing and enhancing readability and writeability through increased TMR effect.

The cell 210 is merely exemplary and is not limited to the configuration shown in FIG. 7. In fact, various modifications to the size, shape, materials, and operation of the cell 210 can be implemented, as desired. As shown, one such modification can be the extension of the pinned layer 212 and bottom electrode 216 to a width 218 that is equal to or greater than twice the width 220 of the free layer 222 and top electrode 224. Such a configuration provides a relatively large pinning region 226 which consequently increases the surface area and pinning connection between the AFM layers 214 and the pinned layer 212.

Furthermore, the width 228 of the tunnel junction 230 can be modified to provide an increased amount of non-magnetic spacer material 232, such as NiO, between the AFM 214 and the free layer 222 to protect the magnetic freedom of the free layer 222. In yet another modification, the AFM 214 can be removed and the pinned layer 212 can be replaced with an asymmetric SAF that individually holds a predetermined magnetic orientation. While the various modifications to the cell 210 can vary the structure and operation, the lateral orientation and connection of the AFM 214 to the pinned layer 212 remains an inhibitor of volatile atom diffusion during annealing, which allows for increased TMR and improved cell 210 function.

Figure 8:
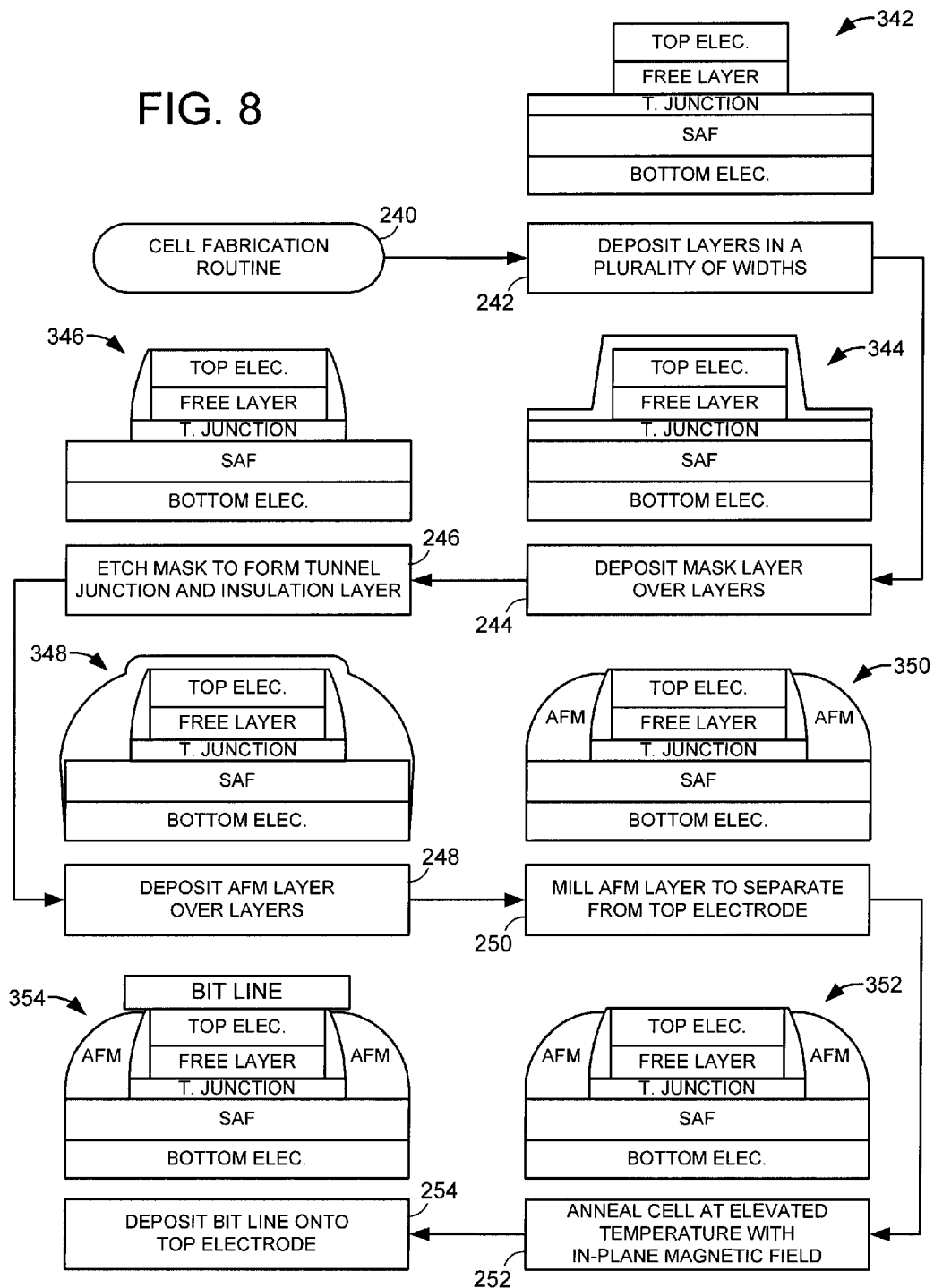
FIG. 8 displays a flow diagram and corresponding illustrative magnetic stacks of an exemplary CELL FABRICATION routine conducted in accordance with the various embodiments of the present invention.

A cell fabrication routine 240 and corresponding illustrative representations are generally displayed in FIG. 8 that form an exemplary memory cell in accordance with the various embodiments of the present invention Initially in step 242, a predetermined number of layers are deposited in at least two widths. While the order, number, and thickness of the various layers are not limited, magnetic stack 342 illustrates a sample result from step 242 in which a bottom electrode, SAF, and tunnel junction have a first width while the free layer and top electrode share a smaller second width.

Step 244 then deposits a mask layer over the previously deposited layers to encase the top portion. Stack 344 visually provides an example of such a mask layer that in some embodiments is an insulative material, such as NiO. The deposited mask layer and tunnel junction is subsequently removed in a predetermined pattern to maintain a selected amount of mask layer about the free layer, as shown in stack 346. The stack 346 further shows that the tunnel junction is removed to define pinning regions on lateral sides of the free layer and SAF.

An AFM material is deposited in step 248 over the existing magnetic stack to at least contact the SAF on the previously defined pinning regions. The shape and material of the AFM layer is not limited, but a sample formation is provided by stack 348 which shows that the AFM material encases the top and sides of the SAF. The routine 240 proceeds to remove portions of the AFM material in step 250 in a predetermined pattern that separates the AFM from the top electrode. While step 250 calls for a milling operation to remove the AFM material, such operation is not required or limited as various processes, such as polishing and etching, can be used individually or in combination to produce a stack similar to stack 350.

With the various component layers of the cell formed and shaped, step 252 anneals the structure in the presence of an elevated temperature and in-plane magnetic field. As discussed above, the lateral position of the AFM material allows minimal diffusion of volatile antiferromagnetic atoms into the SAF during annealing. Stack 352 displays that the annealing maintains the cell's previous configuration but cannot illustrate that the annealing enhance the TMR effect of the interaction between the free layer, SAF, and tunnel junction. Finally in step 254, a bit line is deposited onto the top electrode to provide a conductive pathway that directs read and write current through the cell. Step 254 can have multiple sub-steps that prepare the top electrode's upper surface for deposition or growth of the bit line material. Stack 354 generally illustrates a completed cell from step 254 that is capable of being programmed with a particular magnetic orientation and maintaining such orientation until being reprogrammed.

It should be noted that the fabrication routine 240 is not limited to the steps and corresponding exemplary magnetic stacks shown in FIG. 8. The various steps can be modified or omitted while new steps can be added, as desired. As an example, step 242 can be modified to include the deposition of a single ferromagnetic layer instead of the SAF shown in stack 342 while step 254 can be omitted so that step 252 and corresponding stack 352 is a completed cell that is capable of being implemented into an array to store data.

As can be appreciated by one skilled in the art, the various embodiments illustrated herein provide advantages in both memory cell efficiency and complexity. The ability to enhance the TMR effect of a memory cell through annealing consequently requires less programming current while increasing operating margin. Moreover, the lateral deposition of the AFM layers allows for thinner memory device structure with decreased numbers of errors due to magnetic volatility associated with AFM atom diffusion during annealing. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
   providing a magnetic free layer laterally separated from an antiferromagnetic layer (AFM) by a non-magnetic spacer layer and medially separated from a synthetic antiferromagnetic layer (SAF) by a magnetic tunneling junction;
   pinning the magnetization of the SAF with the AFM through contact with a pinning region of the SAF that laterally extends beyond the magnetic tunneling junction; and
   annealing the magnetic free layer, magnetic tunneling junction, and SAF in the presence of in-plane magnetic field to increase tunnel magnetoresistance between the magnetic free layer and SAF.

2. The method of claim 1, wherein the annealing step concurrently provides an elevated temperature for the magnetic free layer, magnetic tunneling junction, and SAF to increase the tunnel magnetoresistance of the free layer, tunnel junction, and SAF.

3. The method of claim 2, wherein the pinning region inhibits magnetically volatile AFM atoms from diffusing to the SAF during annealing.

4. The method of claim 1, wherein the AFM is deposited to be physically and magnetically separated from the free layer and a top electrode by the spacer layer.

5. The method of claim 1, wherein the AFM pins the SAF with an exchange bias field.

6. The method of claim 1, wherein the SAF is deposited with a first width, the tunnel junction has a second width, and the free layer has a third width, the pinning region defined by the difference between the first and second widths.

7. The method of claim 1, wherein the SAF has a width that is at least twice as long as the width of the free layer.

8. The method of claim 1, wherein the pinning region is formed by removing lateral portions of the tunnel junction.

* * * * *